(12) United States Patent
Mizushima et al.

(10) Patent No.: US 8,236,186 B2
(45) Date of Patent: Aug. 7, 2012

(54) PRODUCTION METHOD OF SUSPENSION BOARD WITH CIRCUIT

(75) Inventors: Aya Mizushima, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 325 days.

(21) Appl. No.: 12/385,576

(22) Filed: Apr. 13, 2009

(65) Prior Publication Data

US 2009/0261060 A1    Oct. 22, 2009

Related U.S. Application Data

(60) Provisional application No. 61/071,405, filed on Apr. 28, 2008.

(30) Foreign Application Priority Data

Apr. 18, 2008  (JP) .................................. 2008-109291

(51) Int. Cl.
*H01B 13/00* (2006.01)
(52) U.S. Cl. ......................... 216/13; 174/255; 174/261
(58) Field of Classification Search ...................... 216/13
See application file for complete search history.

(56) References Cited

U.S. PATENT DOCUMENTS

| | | | |
|---|---|---|---|
| 6,075,710 A * | 6/2000 | Lau | 361/760 |
| 6,399,899 B1 * | 6/2002 | Ohkawa et al. | 174/261 |
| 6,407,345 B1 * | 6/2002 | Hirose et al. | 174/261 |
| 2002/0100607 A1 * | 8/2002 | Girard et al. | 174/250 |
| 2005/0061542 A1 * | 3/2005 | Aonuma et al. | 174/255 |

FOREIGN PATENT DOCUMENTS

| JP | 2001-209918 | 8/2001 |
|---|---|---|
| JP | 2005-100488 | 4/2005 |

* cited by examiner

*Primary Examiner* — Binh X Tran
*Assistant Examiner* — David Cathey, Jr.
(74) *Attorney, Agent, or Firm* — Jean C. Edwards, Esq.; Edwards Neils PLLC

(57) ABSTRACT

A production method of a suspension board with circuit includes the steps of forming, on a metal supporting board, an insulating layer formed with a first opening, forming a metal thin film on the insulating layer and on the metal supporting board exposed from the first opening, forming, on a surface of the metal thin film, a conductive layer having terminal portions forming, on the terminal portions, a metal plating layer by electrolytic plating using the metal supporting board as a lead, forming a second opening in a portion of the metal supporting board opposing the first opening, and partially etching the metal supporting board to form the suspension board with circuit and a support frame. In the step of forming the insulating layer, the first opening is formed in the insulating layer in which the supporting frame is formed.

8 Claims, 6 Drawing Sheets

(a)

(b)

(c)

(d)

(e)

(f)

(g)

(h)

(i)

(a)

(b)

PRODUCTION METHOD OF SUSPENSION BOARD WITH CIRCUIT

CROSS-REFERENCE TO RELATED APPLICATIONS

This application claims the benefit of U.S. Provisional Application No. 61/071,405, filed Apr. 28, 2008, and claims priority from Japanese Patent Application No. 2008-109291, filed Apr. 18, 2008, the contents of which are herein incorporated by reference in their entirety.

BACKGROUND OF THE INVENTION

1. Field of the Invention

The present invention relates to a production method of a suspension board with circuit.

2. Description of the Related Art

Conventionally, a suspension board with circuit has been known which includes a metal supporting layer, an insulating layer formed on the metal supporting layer, a conductive layer formed on the insulating layer, having signal wires and terminal portions connected thereto, and a metal thin film interposed between the conductive layer and the insulating layer.

In the production of such a suspension board with circuit, e.g., after second openings are formed in an insulating layer, and a conductive layer is formed to fill the second openings, pad portions are formed on terminal portions using a metal supporting layer as a lead portion for electrolytic plating. Thereafter, to prevent a short circuit between the metal supporting layer and the conductive layer, it has been proposed to bore first openings in the portions of the metal supporting layer opposing the second openings such that the first openings surround the individual second openings, and are kept from contact with the peripheral edges of the second openings (see, e.g., Japanese Unexamined Patent Publication No. 2005-100488 (FIGS. 2 and 3)).

SUMMARY OF THE INVENTION

However, in the formation of the pad portions using electrolytic plating, the second openings are each filled with the conductive layer. Accordingly, to ensure the reliability of conduction of a plating current, the second openings need to be formed relatively large.

On the other hand, in recent years, formation of signal wires at a fine pitch has been promoted in a suspension board with circuit.

Consequently, it is extremely difficult to form the first openings correspondingly to the signal wires formed at a fine pitch in the suspension board with circuit.

When the second openings are formed in the suspension board with circuit, it is necessary to dispose additional wires different from the signal wires in the suspension board with circuit, so that the layout flexibility of the conductive layer including the signal wires deteriorates.

It is therefore an object of the present invention to provide a production method of a suspension board with circuit which allows layout of a conductive layer with high flexibility, while ensuring the reliability of conduction of a plating current in electrolytic plating using a metal supporting board as a lead.

A production method of a suspension board with circuit of the present invention includes the steps of forming, on a metal supporting board, an insulating layer formed with a first opening in correspondence to the suspension board with circuit, forming a metal thin film on the insulating layer and on the metal supporting board exposed from the first opening, forming, on a surface of the metal thin film, a conductive layer having a plurality of signal wires and terminal portions connected to the individual signal wires in correspondence to the suspension board with circuit, forming, on the terminal portions, a metal plating layer by electrolytic plating using the metal supporting board as a lead in correspondence to the suspension board with circuit, forming a second opening in a portion of the metal supporting board opposing the first opening such that the second opening surrounds the first opening, and is kept from contact with a peripheral edge of the first opening, and partially etching the metal supporting board correspondingly to an outer shape of the suspension board with circuit to form a metal supporting layer, and thus form the suspension board with circuit and a support frame for supporting the suspension board with circuit, wherein, in the step of forming the insulating layer, the first opening is formed in the insulating layer in which the supporting frame is formed.

In the method, the first opening is formed in the insulating layer in which the supporting frame occupying a relatively large area is formed. Accordingly, in the supporting frame, a conductive material for forming the conductive layer is caused to fill the first opening to ensure electrical conduction between the conductive material and the metal supporting board via the metal thin film. As a result, it is possible to ensure the reliability of conduction of a plating current in electrolytic plating using the metal supporting board as a lead.

Because the first opening need not be formed in the suspension board with circuit, the layout of the conductive layer can be performed with high flexibility in the suspension board with circuit.

In addition, in the method, the second opening is bored in the portion of the metal supporting board opposing the first opening such that the second opening surrounds the first opening, and is kept from contact with the peripheral edge of the first opening. Therefore, after electrolytic plating, it is possible to reliably prevent a short circuit between the conductive layer and the metal supporting board.

In the production method of the suspension board with circuit of the present invention, it is preferable that the first opening is provided in one-to-one correspondence to each of the individual signal wires.

In the method, the metal plating layer corresponding to each of the individual signal wires can be formed with high reliability.

In the production method of the suspension board with circuit of the present invention, it is preferable that the first opening is provided in one-to-one correspondence to the individual suspension board with circuit.

In the method, the metal plating layer corresponding to the individual wired circuit board can be formed with high reliability.

In the production method of the suspension board with circuit of the present invention, it is preferable that the second opening is provided in one-to-one correspondence to the individual first opening.

In the method, it is possible to reliably interrupt the electrical conduction between the metal supporting board and the conductive layer in the individual first opening using the second opening corresponding thereto. This allows reliable prevention of a short circuit therebetween.

DETAILED DESCRIPTION OF THE INVENTION

Figure 1:
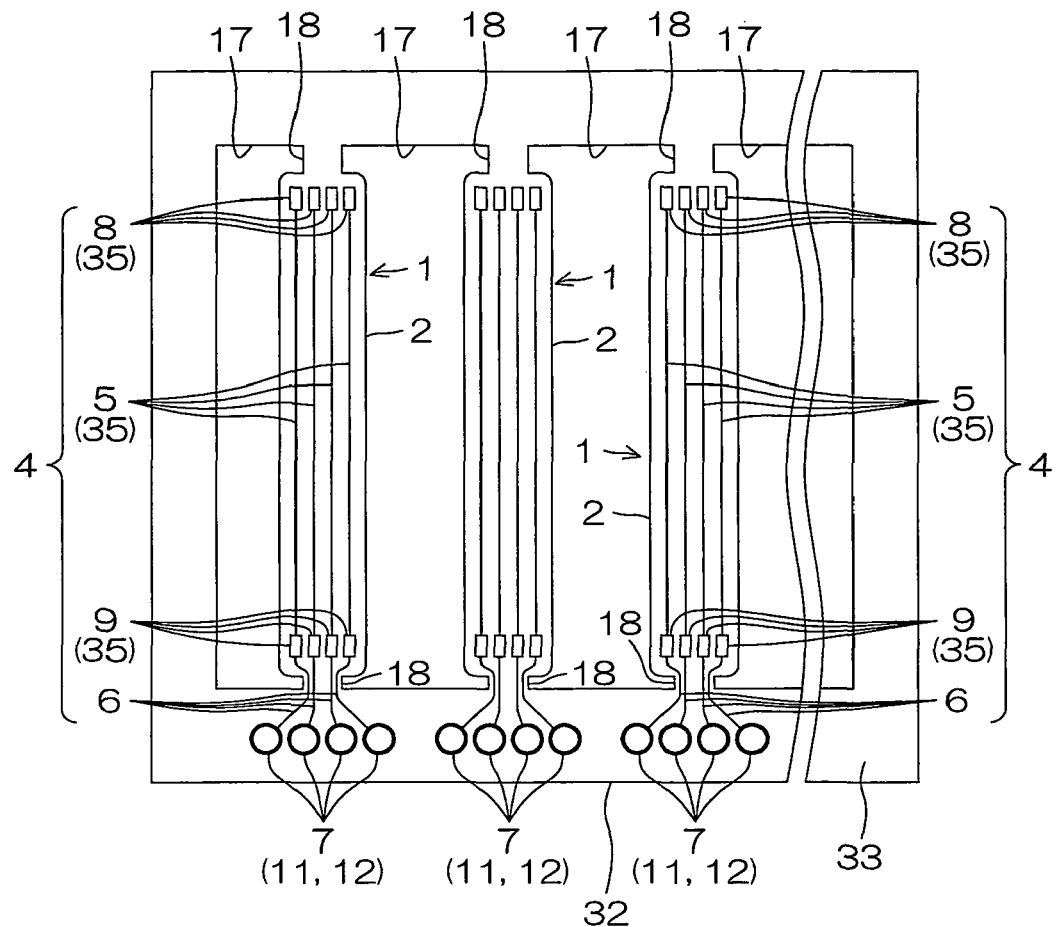
FIG. 1 is a plan view of an assembly sheet provided with suspension boards with circuit obtained according to an embodiment of a production method of a suspension board with circuit of the present invention.
Figure 2:
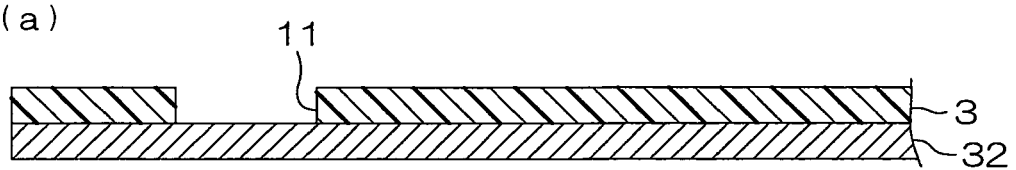
FIG. 2 is a process view for illustrating the embodiment of the production method of a suspension board with circuit of the present invention, (a) showing the step of forming an insulating base layer formed with first openings on a metal supporting board in correspondence to the suspension boards with circuit, (b) showing the step of forming a metal thin film on the insulating base layer and on the supporting board exposed from the first openings, (c) showing the step of forming a conductive layer in correspondence to the suspension boards with circuit, (d) showing the step of removing the metal thin film exposed from the conductive layer, and (e) showing the step of forming a metal coating.
Figure 2:
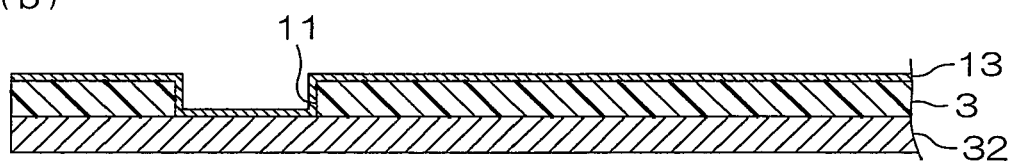
Figure 2:
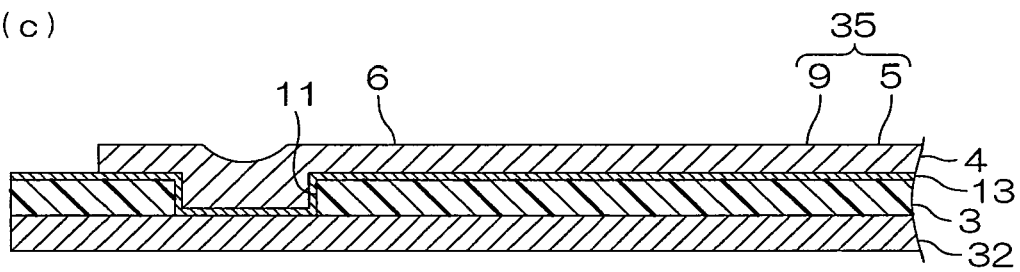
Figure 2:
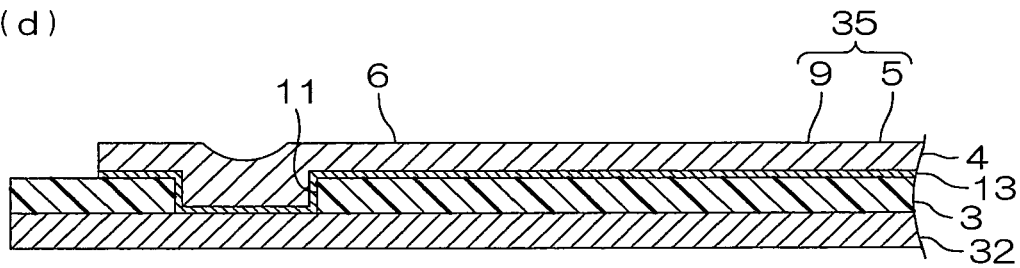
Figure 2:
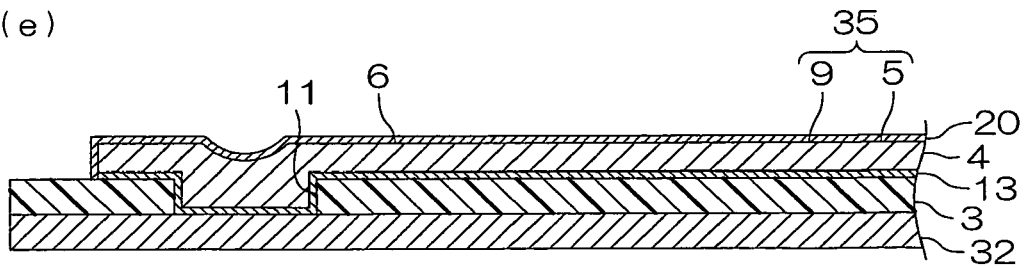
Figure 3:
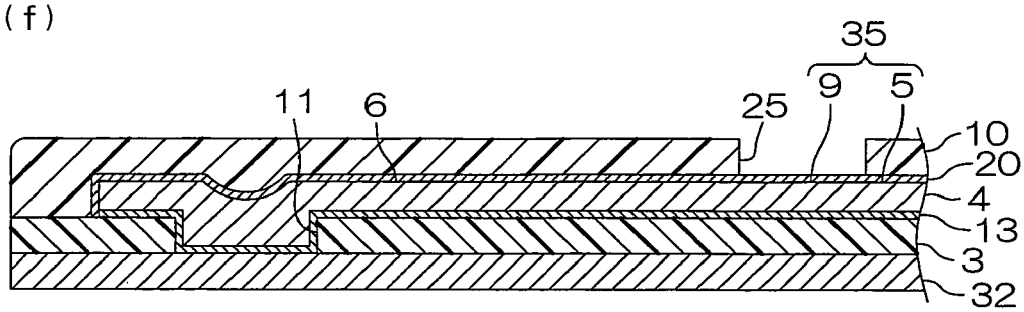
FIG. 3 is a process view for illustrating, subsequently to FIG. 2, the embodiment of the production method of a suspension board with circuit of the present invention, (f) showing the step of forming an insulating cover layer formed with terminal openings, (g) showing the step of removing the metal coating exposed from the terminal openings, (h) showing the step of forming, by electrolytic plating, a metal plating layer on the surface of the conductive layer exposed from the terminal openings, and (i) showing the step of etching the metal supporting board to form second openings, while forming a metal supporting layer.
Figure 3:
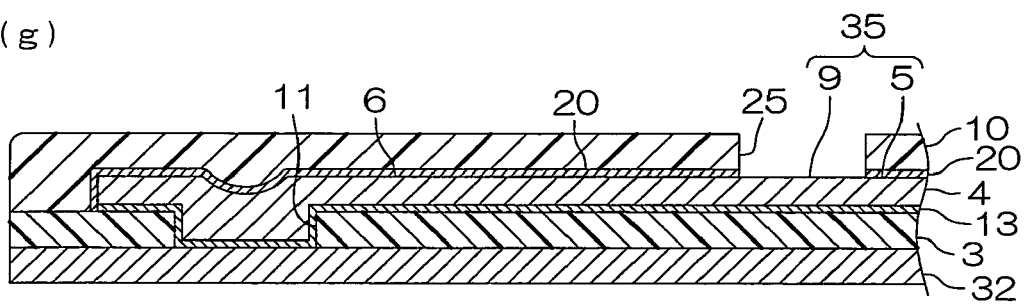
Figure 3:
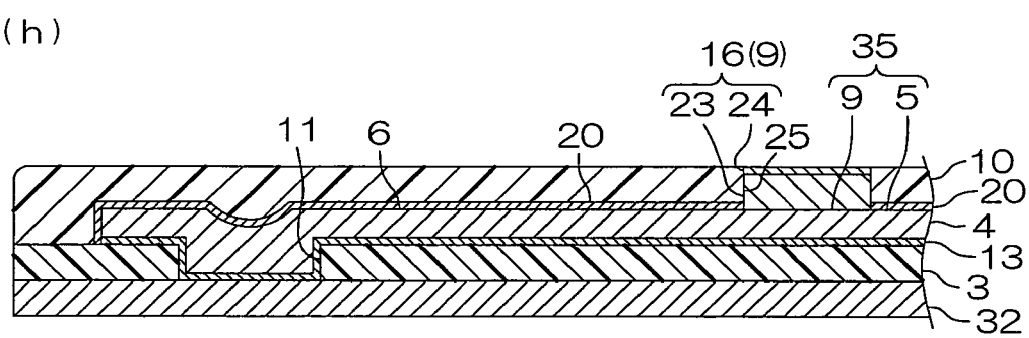
Figure 3:
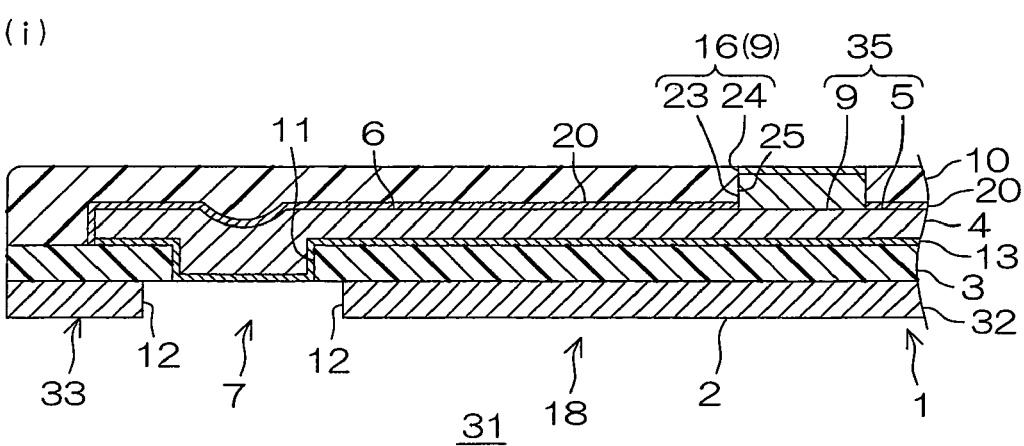
Figure 4:
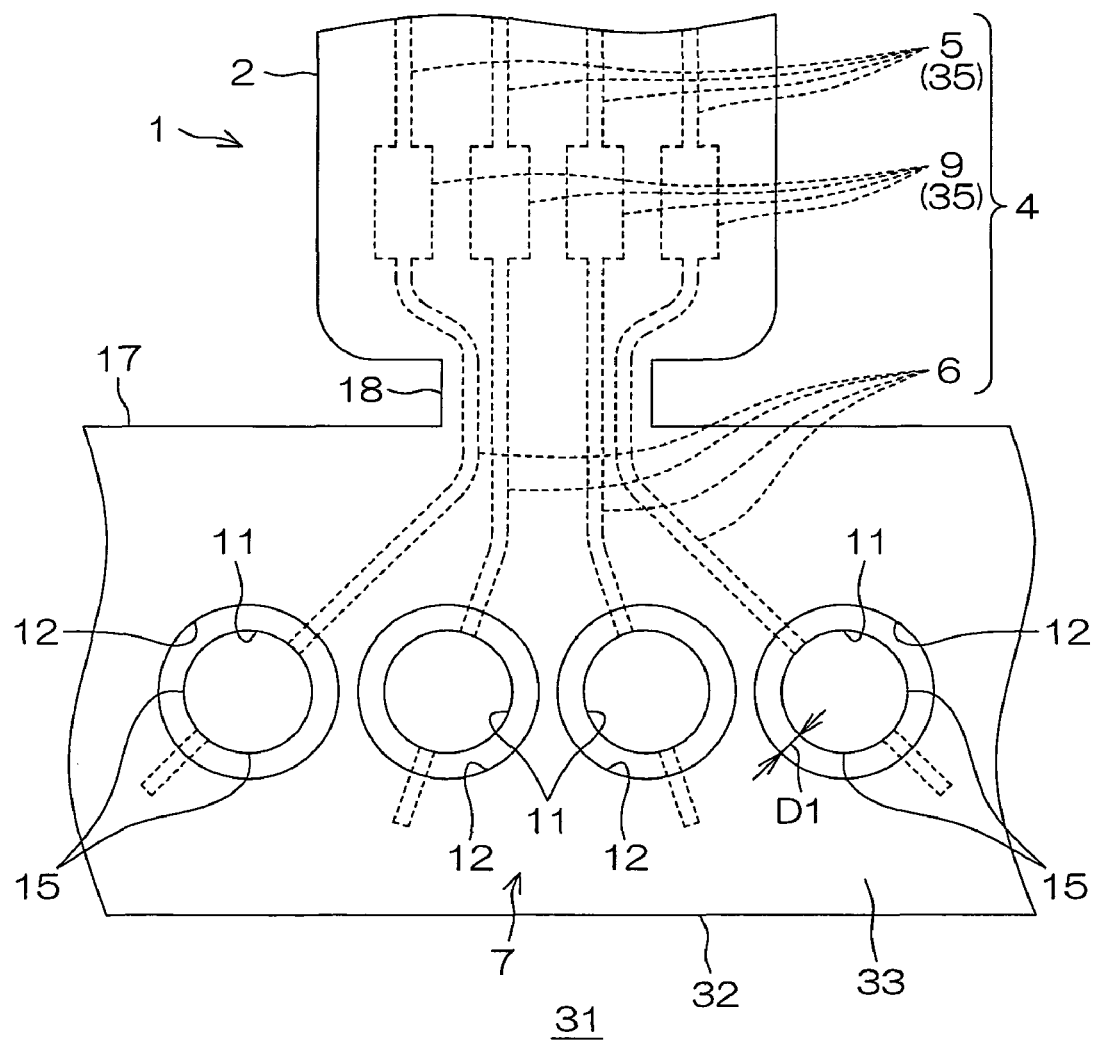
FIG. 4 is an enlarged bottom view of each of the opening formation portions of the assembly sheet shown in FIG. 1.

FIG. 1 is a plan view of a suspension board with circuit assembly sheet (hereinafter, simply referred to also as an assembly sheet) provided with suspension boards with circuit obtained according to an embodiment of a production method of a suspension board with circuit of the present invention. FIGS. 2 and 3 are process views each for illustrating the embodiment of the production method of a suspension board with circuit of the present invention. FIG. 4 is an enlarged bottom view of each of the opening formation portions of the assembly sheet shown in FIG. 1.

In FIG. 1, an insulating base layer and an insulating cover layer, each described later, are omitted for clear illustration of relative positioning of a conductive layer described later. FIGS. 2 and 3 show a part of a cross section of the assembly sheet along signal wires, external connection terminal portions, and lead wires, which are described later.

In FIG. 1, a plurality of suspension boards with circuit 1 are provided in an assembly sheet 31. The suspension boards with circuit 1 are formed to extend in a longitudinal direction, while being supported by a supporting frame 33. Specifically, the suspension boards with circuit 1 are arranged in an aligned state within the supporting frame 33 to be spaced apart from each other in a widthwise direction (perpendicular to the longitudinal direction), and supported by the supporting frame 33 via joints 18.

Each of the suspension boards with circuit 1, on which a magnetic head (not shown) of a hard disk drive is mounted, supports the magnetic head, while holding a minute gap between the magnetic head and a magnetic disk (not shown), against an air flow when the magnetic head and the magnetic disk travel relatively to each other. In the suspension board with circuit 1, a conductive pattern 35 for connecting the magnetic head and a read/write board (not shown) is integrally formed.

The conductive pattern 35 integrally includes a plurality of (four) signal wires 5, magnetic-head-side connection terminals 8 connected to the signal wires 5 as terminal portions to be connected to the connection terminals of the magnetic head, and external connection terminals 9 connected to the signal wires 5 as terminal portions to be connected to the connection terminals of the read/write board, which are described later.

As shown in FIG. 3(*i*), each of the suspension boards with circuit 1 includes a metal supporting layer 2, an insulating base layer 3 as an insulating layer formed on the metal supporting layer 2, the conductive pattern 35 formed on the insulating base layer 3, a metal thin film 13 formed on the surface of the conductive pattern 35, and an insulating cover layer 10 formed on the insulating base layer 3 so as to cover the conductive pattern 35.

As shown in FIGS. 1 and 3(*i*), the metal supporting layer 2 is made of a flat thin plate which is formed from a metal supporting board 32 together with the supporting frame 33, and extends in the longitudinal direction. Examples of a metal used to form the metal supporting board 32 including the metal supporting layer 2 include stainless steel and a 42-alloy. Preferably, stainless steel is used in terms of adhesion with the insulating base layer 3.

As shown in FIG. 3(*i*), in the suspension board with circuit 1, the insulating base layer 3 is formed in a pattern corresponding to a portion where the conductive pattern 35 is formed on the metal supporting layer 2. Examples of an insulating material used to form the insulating base layer 3 include synthetic resins such as a polyimide resin, an acrylic resin, a polyether nitrile resin, a polyether sulfone resin, a polyethylene terephthalate resin, a polyethylene naphthalate resin, and a polyvinyl chloride resin. Among them, a photosensitive synthetic resin is preferably used to form the insulating base layer 3 in the pattern, or more preferably, a photosensitive polyimide resin is used.

As shown in FIG. 1, the conductive pattern 35 integrally includes the plurality of signal wires 5 extending along the longitudinal direction, and arranged in parallel to be spaced apart from each other in the widthwise direction, the magnetic-head-side connection terminals 8 continued from the respective front end portions (one longitudinal end portions) of the individual signal wires 5, and the external connection terminals 9 continued from the respective rear end portions (the other longitudinal end portions) of the individual signal wires 5. Examples of a conductive material used to form the conductive pattern 35 include metal foils of copper, nickel, gold, a solder, and an alloy thereof. In terms of conductivity, low cost, and processibility, a copper foil is preferably used.

As shown in FIG. 3(i), a metal plating layer 16 is formed on the magnetic-head-side connection terminals 8 and on the external connection terminals 9 (the magnetic-head-side connection terminals 8 and the metal plating layer 16 corresponding thereto are omitted in FIG. 3).

Examples of a metal used to form the metal plating layer 16 include copper, nickel, chromium, and gold.

The metal plating layer 16 may also be formed of multiple layers. For example, as shown in FIG. 3(h), the metal plating layer 16 may also be formed of a first plating layer 23, and a second plating layer 24 laminated on the first plating layer 23. In this case, the first plating layer 23 is made of, e.g., nickel, and the second plating layer 24 is made of, e.g., gold.

The metal thin film 13 is formed on the surface (lower surface) of the conductive layer 4 in the suspension board with circuit 1. More specifically, the metal thin film 13 is interposed between the insulating base layer 3 and the conductive layer 4 in the suspension board with circuit 1. Examples of a metal used to form the metal thin film 13 include chromium and copper.

As shown in FIG. 3(i), the insulating cover layer 10 is formed in a pattern covering the signal wires 5 on the insulating base layer 3 in the suspension board with circuit 1. In the insulating cover layer 10, terminal openings 25 for respectively exposing the magnetic head-side connection terminals 8 and the external connection terminals 9 are formed (the magnetic head-side connection terminals 8 and the terminal openings 25 corresponding thereto are omitted in FIG. 3).

As an insulating material for forming the insulating cover layer 10, the same insulating material as used to form the insulating base layer 3 mentioned above is used. Preferably, a photosensitive polyimide resin is used.

As shown in FIG. 1, the supporting frame 33 is provided as a frame surrounding the suspension boards with circuit 1 in the assembly sheet 31, and formed in a generally rectangular frame shape when viewed in plan view. In a production method of the suspension boards with circuit 1 described later, the supporting frame 33 is formed together with the joints 18 and the metal supporting layer 2 by partially cutting out the metal supporting board 32 such that it corresponds to the outer shapes of the suspension boards with circuit 1.

In the supporting frame 33, trenches 17 surrounding the individual suspension boards with circuit 1 are also formed between the inner peripheral edge portion of the supporting frame 33 surrounding the suspension boards with circuit 1 in the longitudinal direction and the widthwise direction and the outer peripheral edge portions (except for the widthwise centers) of the suspension boards with circuit 1.

In such a manner as to traverse the trenches 17, the plurality of joints 18 are formed. The joints 18 are provided in spanning relation between the both longitudinal end portions of the suspension boards with circuit 1 and the supporting frame 33 disposed to oppose the both longitudinal end portions of the suspension boards with circuit 1 in the longitudinal direction. The joints 18 are each in a generally rectangular shape when viewed in plan view, and formed to extend from the outer peripheral edge portions at the widthwise centers of the both longitudinal end portions of the suspension boards with circuit 1, pass through the trenches 17 in the longitudinal direction, and reach the outer peripheral edge portion of the supporting frame 33 extending in the widthwise direction. The joints 18 are each appropriately designed to have a size depending on the widths of lead wires 6 described later and on the spacing between the individual lead wires 6. The width (widthwise length) of the joint 18 is in a range of, e.g., 100 to 1000 µm, or preferably 200 to 500 µm. The length (longitudinal length) of the joint 18 is in a range of, e.g., 100 to 2000 µm, or preferably 100 to 1000 µm.

As shown in FIG. 3(i), the supporting frame 33 includes the metal supporting board 32, the insulating base layer 3 formed on the metal supporting board 32, the lead wires 6 formed on the insulating base layer 3, the metal thin film 13 formed on the surfaces (lower surfaces) of the lead wires 6, and the insulating cover layer 10 formed on the insulating base layer 3 so as to cover the lead wires 6.

The insulating base layer 3 is formed in a pattern corresponding to the lead wires 6 described next.

As shown in FIG. 4, the plurality of lead wires 6 are provided correspondingly to the external connection terminals 9. That is, the lead wires 6 are connected to the individual external connection terminals 9, and formed to extend from the respective rear end portions of the individual external connection terminals 9, pass through the joints 18, and reach opening formation portions 7 described later in the supporting frame 33. Specifically, the lead wires 6 are arranged in a radial shape gradually expanding in the widthwise direction from the joints 18 toward the rear side in the supporting frame 33. The lead wires 6 form the conductive layer 4 together with the conductive pattern 35 in the assembly sheet 31. The lead wires 6 are formed with respective protruding portions 15 each having a generally semi-circular shape which widthwise protrudes in the first opening 11 when viewed in plan view.

As shown in FIG. 3(i), the metal thin film 13 is formed on the lower surfaces (and on the lower surfaces and side surfaces of the lead wires 6 in the first openings 11 described next) of the lead wires 6 in the supporting frame 33.

In the supporting frame 33, the opening formation portions 7 are formed.

The opening formation portions 7 are each formed of the first opening 11 and the second opening 12.

The first openings 11 are formed in the insulating base layer 3. Specifically, the first openings 11 are formed in the insulating base layer 3 so as to extend therethrough in a thickness direction. As shown in FIG. 4, the first openings 11 are each formed in a generally circular shape when viewed in bottom view.

The first openings 11 are provided in one-to-one corresponding relation to the individual signal wires 5. That is, a plurality of the (four) first openings 11 are provided for each of the individual suspension boards with circuit 1.

In terms of ensuring the reliability of conduction of a plating current in electrolytic plating, the inner diameter of the first opening 11 is in a range of, e.g., not less than 50 µm, preferably not less than 60 µm, or more preferably not less than 80 µm, and normally not more than 2000 µm, or preferably not more than 1000 µm.

As shown in FIGS. 3(i) and 4, the second openings 12 are formed in the metal supporting board 32. Specifically, the second openings 12 are provided in one-to-one corresponding relation to the individual first openings 11. The second openings 12 are formed in the metal supporting board 32 to be disposed in opposing relation to the first openings 11 in the thickness direction, and extend through the metal supporting board 32 in the thickness direction thereof. That is, the second openings 12 are formed to surround the individual first openings, and be kept from contact with the peripheral edges of the first openings 11 when viewed in bottom view (when projected in the thickness direction). More specifically, the second openings 12 are each formed in a generally circular shape surrounding the first opening 11 (protruding portion 15), and larger than the first opening 11 when projected in the thickness direction.

In terms of preventing a short circuit between the conductive layer 4 and the metal supporting board 32 after electrolytic plating (FIG. 3(i)), the inner diameter of the second opening 12 is in a range of, e.g., not less than 50 µm, preferably not less than 80 µm, or more preferably not less than 120 µm, and normally not more than 2000 µm, or preferably not more than 1000 µm. The distance D1 (FIG. 4) between the inner side surface of the second opening 12 and the inner side surface of the first opening 11 is in a range of, e.g., not less than 10 µm, preferably not less than 20 µm, or more preferably not less than 40 µm, and normally not more than 200 µm, or preferably not more than 100 µm.

Next, a production method of the assembly sheet 31 is described with reference to FIGS. 2 and 3. In the method, as shown in FIG. 2(a), the metal supporting board 32 is prepared first, and the insulating base layer 3 formed with the first openings 11 is formed on the metal supporting board 32 in correspondence to the suspension boards with circuit 1.

The thickness of the metal supporting board 32 is in a range of, e.g., 10 to 60 µm, or preferably 15 to 30 µm.

To form the insulating base layer 3 formed with the first openings 11 on the metal supporting board 32 in correspondence to the suspension boards with circuit 1, a varnish of a photosensitive synthetic resin is coated on the surface of the metal supporting board 32, and then cured after photoprocessing, for example. In the case where the photosensitive synthetic resin is not used, a synthetic resin is coated on the metal supporting board 32, or stuck as a dry film to the surface of the metal supporting board 32 in a pattern corresponding to the suspension boards with circuit 1, for example.

The thickness of the insulating base layer 3 thus formed is in a range of, e.g., 2 to 30 µm, or preferably 5 to 20 µm.

In the formation of the insulating base layer 3, the first openings 11 are formed in the insulating base layer 3 in which the supporting frame 33 is to be formed by the subsequent step (FIG. 3(i)) of etching the metal supporting board 32.

Next, as shown in FIG. 2(b), the metal thin film 13 is formed on the insulating base layer 3 and on the metal supporting board 32 exposed from the first openings 11.

For the formation of the metal thin film 13, a vacuum vapor deposition method, especially a sputter vacuum vapor deposition method is preferably used. More specifically, a chromium thin film and a copper thin film are successively formed on the surface (the upper surface of the insulating base layer 3 and the inner side surfaces of the first openings 11 in the insulating base layer 3) and on the surface of the metal supporting board 32 exposed from the first openings 11 by the sputter vapor deposition method, for example. The thickness of the chromium thin film is in a range of, e.g., 100 to 600 Å. The thickness of the copper thin film is in a range of, e.g., 500 to 2000 Å.

Next, as shown in FIG. 2(c), the conductive layer 4 is formed on the surface of the metal thin film 13 formed on the insulating base layer 3 and in the first openings 11 in correspondence to the suspension boards with circuit 1.

In the formation of the conductive layer 4, plating, e.g., is used. Specifically, a plating resist in a pattern reverse to the conductive pattern 35 (the signal wires 5, the magnetic-head-side connection terminals 8, and the external connection terminals 9) and to the pattern of the lead wires 6 is formed first on the metal thin film 13. Then, the conductive layer 4 in the same pattern as the conductive pattern 35 and the pattern of the lead wires 6 is formed by plating on the portion of the insulating base layer 3 where the plating resist is not formed. As the plating, electrolytic plating or electroless plating is used. Preferably, electrolytic plating is used, or more preferably electrolytic copper plating is used.

The lead wires 6 of the conductive layer 4 thus formed fill the first openings 11, and are in electrical conduction with the metal supporting board 32 via the metal thin film 13 in the first openings 11.

The thickness of the conductive layer 4 is in a range of, e.g., 2 to 15 µm, or preferably 5 to 10 µm. The width of the signal wire 5 is in a range of, e.g., 10 to 500 µm, or preferably 30 to 200 µm. The spacing between the individual signal wires 5 is in a range of, e.g., 10 to 200 µm, or preferably 30 to 100 µm. The width of the magnetic-head-side connection terminal 8 and the width of the external connection terminal 9 are each in a range of, e.g., 20 to 1000 µm, or preferably 30 to 800 µm. The spacing between the individual magnetic-head-side connection terminals 8 and the spacing between the individual external connection terminals 9 are each in a range of, e.g., 20 to 1000 µm, or preferably 30 to 800 µm.

The width of the lead wire 6 is in a range of, e.g., 50 to 500 µm, or preferably 100 to 300 µm. The spacing between the individual lead wires 6 is in a range of, e.g., 10 to 3000 µm, or preferably 20 to 200 µm.

Thereafter, the plating resist is removed by known etching such as, e.g., chemical etching (wet etching) or by stripping.

Next, as shown in FIG. 2(d), the metal thin film 13 (i.e., the portion of the metal thin film 13 where the plating resist is formed) exposed from the conductive layer 4 is also removed by known etching such as chemical etching (wet etching).

Thereafter, as shown in FIG. 2(e), the metal coating 20 is formed on the surface of the conductive layer 4. The metal coating 20 is preferably formed as a hard nickel coating by electroless nickel plating. The thickness of the metal coating 20 is sufficient as long as it prevents the exposure of the surface of the conductive layer 4. The thickness of the metal coating 20 is in a range of, e.g., about 0.05 to 0.1 µm.

Next, as shown in FIG. 3(f), the insulating cover layer 10 is formed in the foregoing pattern.

For the formation of the insulating cover layer 10, the same method as used to form the insulating base layer 3 is used. The thickness of the insulating cover layer 10 is in a range of, e.g., 1 to 30 µm, or preferably 2 to 5 µm.

Next, as shown in FIG. 3(g), the metal coating 20 exposed from the terminal openings 25 is removed by, e.g., stripping or the like.

Then, as shown in FIG. 3(h), the metal plating layer 16 is formed by electrolytic plating on (the upper surface of) the conductive layer 4 exposed from the terminal openings 25 in correspondence to the suspension boards with circuit 1.

To form the metal plating layer 16 by electrolytic plating, the metal supporting board 32 and the insulating cover layer 10 are covered first with a plating resist except for the portions thereof where the metal plating layer 16 is to be formed. Then, since the conductive layer 4 is in electrical conduction with the metal supporting board 32 via the metal thin film 13 in the first openings 11, electrolytic plating is performed using the metal supporting board 32 as a lead. Specifically, electrolytic nickel plating and electrolytic gold plating are successively performed using the metal supporting board 32 as a lead to successively laminate the first plating layer 23 made of nickel, and the second plating layer 24 made of gold.

The thickness of the metal plating layer 16 thus formed is in a range of, e.g., about 2 to 10 µm. Specifically, the respective thicknesses of the first plating layer 23 and the second plating layer 24 are each in a range of, e.g., about 1 to 5 µm.

Thereafter, as shown in FIG. 3(i), the metal supporting board 32 is etched to form the second openings 12, and form the metal supporting layer 2.

For the etching of the metal supporting board 32, dry etching, wet etching (chemical etching), or the like is used for example, or preferably chemical etching is used.

To bore the second openings 12, the portions of the metal supporting board 32 opposing the first openings 11 in the thickness direction are etched. As a result, the second openings 12 which surround the individual first openings 11, and are kept from contact with the peripheral edges of the first openings 11 are formed.

For the formation of the metal supporting layer 2, the metal supporting board 32 is partially etched so as to correspond to the outer shapes of the suspension boards with circuit 1. That is, the trenches 17 are formed (bored) by etching. In this manner, the suspension boards with circuit 1 and the supporting frame 33 are formed to form the assembly sheet 31 including the suspension boards with circuit 1 and the supporting frame 33.

Although a method for forming the magnetic-head-side connection terminals 8 has not been described above, the magnetic-head-side connection terminals 8 are also formed similarly to the external connection terminal portions 9.

Thereafter, the joints 18 (see FIG. 1) are cut as necessary, though not shown, to cut away and separate each of the suspension boards with circuit 1 from the supporting frame 33.

In the method, the first openings 11 are formed in the insulating base layer 3 at a position within the supporting frame 33 which occupies a relatively large area. As a result, it is possible to ensure the reliability of conduction of a plating current in electrolytic plating using the metal supporting board 32 as a lead by, in the supporting frame 33, filling the first openings 11 with the lead wires 6 to ensure electrical conduction between the lead wires 6 and the metal supporting board 32 via the metal thin film 13.

Additionally, because the first openings 11 need not be formed in the suspension boards with circuit 1, the layout of the conductive layer 4 (the signal wires 5, the magnetic-head-side connection terminals 8, and the external connection terminal portions 9) can be performed with high flexibility in the suspension boards with circuit 1.

Moreover, since the second openings 12 are bored in the portions of the metal supporting board 32 opposing the first openings 11 so as to surround the individual first openings 11, and be kept from contact with the peripheral edges of the first openings 11, it is possible to reliably prevent a short circuit between the conductive layer 4 and the metal supporting board 32 after electrolytic plating.

Further, since the first openings 11 are provided in one-to-one relation to the individual signal wires 5, the metal plating layer 16 corresponding to each of the individual signal wires 5 can be formed with high reliability.

Furthermore, since the second openings 12 are provided in one-to-one relation to the individual first openings 11, it is possible to reliably interrupt the electrical conduction between the metal supporting board 32 and the conductive layer 4 in each of the first openings 11 using the second opening 12 corresponding thereto, and reliably prevent a short circuit therebetween.

In the description given above, the first openings 11 and the second openings 12 are each formed in a generally circular shape when viewed in bottom view. However, the shapes of the first openings 11 and the second openings 12 are not particularly limited. Depending on the purpose and application thereof, each of the first openings 11 and the second openings 12 can be formed into an appropriate shape such as, e.g., a generally polygonal shape when viewed in bottom view, though not shown.

In the description given above, the metal plating layer 16 is formed by electrolytic plating on the magnetic-head-side connection terminals 8 and the external connection terminal portions 9 using the metal supporting board 32 as a lead. However, the position where the metal plating layer 16 is formed by electrolytic plating using the metal supporting board 32 as a lead is not limited to the position shown above. For example, the metal plating layer 16 can also be formed on a test-side connection terminal (terminal for testing) used in a conduction test after the production of the suspension boards with circuit 1, though not shown.

Figure 5:
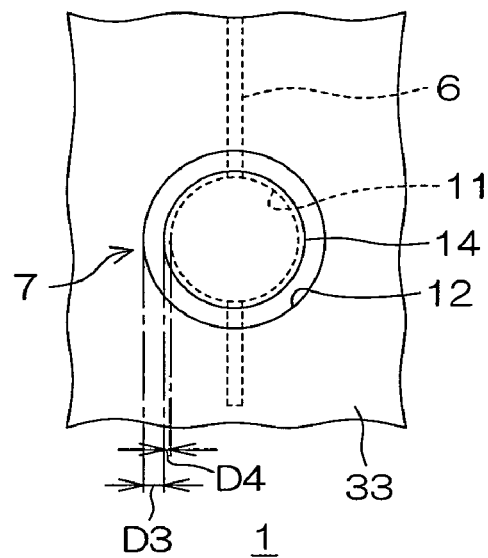
FIG. 5 shows each of the opening formation portions of an assembly sheet provided with suspension boards with circuit obtained according to another embodiment (in which the first openings are covered) of the production method of a suspension board with circuit of the present invention, (a) showing an enlarged bottom view thereof, and (b) showing a cross-sectional view thereof.
Figure 5:
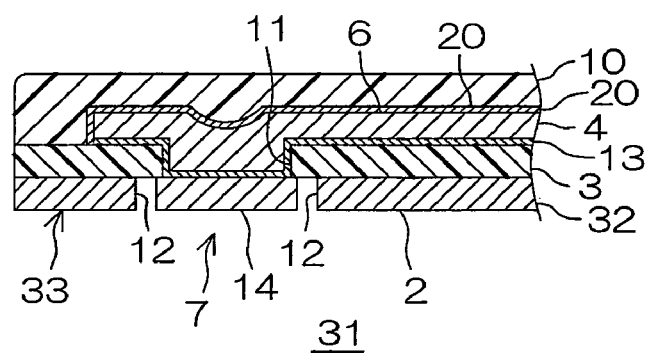

FIG. 5 shows each of the opening formation portions of an assembly sheet provided with suspension boards with circuit obtained according to another embodiment (in which the first openings are covered) of the production method of a suspension board with circuit of the present invention, in which FIG. 5(a) shows an enlarged bottom view thereof, and FIG. 5(b) shows a cross-sectional view thereof.

In the description given above, the first openings 11 are exposed from the second openings 12. However, as shown in FIGS. 5(a) and 5(b), the first openings can also be covered with covering portions 14.

The covering portions 14 are each formed of, e.g., the same metal as the metal forming the metal supporting board 32. The covering portions 14 are provided in the second openings 12, and disposed to be spaced apart from the inner side surfaces of the second openings 12. Specifically, the outer side surfaces of the covering portions 14 are disposed inside the inner side surfaces of the first openings 12, and outside the inner side surfaces of the first openings 11 when viewed in bottom view (when projected in the thickness direction). That is, the outer side surfaces of the covering portions 14 are located between the inner side surfaces of the second openings 12 and the inner side surfaces of the first openings 11 when viewed in bottom view (when projected in the thickness direction).

The upper surfaces of the covering portions 14 are in contact with the lower surfaces (the metal thin film 13 formed on the lower surfaces of the lead wires 6 exposed from the first openings 11) of the lead wires 6 exposed from the first openings 11 and on the lower surface of the insulating base layer 3 around the peripheries of the first openings 11. In this manner, the covering portions 14 are in conduction with the lead wires 6 via the metal thin film 13, while the electrical conduction thereof with the metal supporting board 32 around the outer peripheries of the second openings 12 is interrupted.

The distance D3 between the outer side surface of the covering portion 14 and the inner side surface of the second opening 12 is in a range of, e.g., 10 to 500 µm, or preferably 10 to 100 µm. The distance D4 between the outer side surface of the covering portion 14 and the inner side surface of the first opening 11 is in a range of, e.g., 10 to 100 µm, or preferably 10 to 40 µm.

In the suspension boards with circuit 1, the first openings 11 are covered with the covering portions 14. Accordingly, in a cleaning step after the production of the suspension boards with circuit 1 or the like, it is possible to prevent entrance of a chemical solution into the first openings 11.

In particular, even when a stress is placed on the insulating base layer 3 and on the lead wires 6 filling the first openings 11 of the insulating base layer 3 during the production process of the suspension boards with circuit 1, and the metal thin film 13 in the first openings 11 is interfacially delaminated from the insulating layer 3, the covering portions 14 covering the first openings 11 can prevent entrance of the chemical solution into the interface between the metal thin film 13 and the insulating layer 3 in the first openings 11. This allows effective prevention of corrosion (discoloration) of the lead wires 6.

In addition, even when there is a defect in the metal thin film 13 exposed from the first openings 11, the covering portions 14 covering the first openings 11 can effectively prevent corrosion of the lead wires 6.

Figure 6:
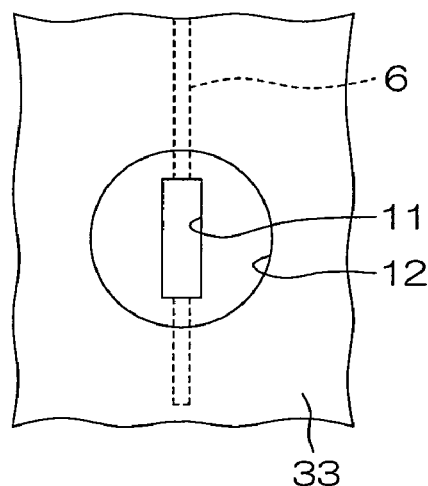
FIG. 6 is an enlarged bottom view of each of the opening formation portions of an assembly sheet provided with suspension boards with circuit obtained according to still another embodiment (in which lead wires in the first openings are linear) of the production method of a suspension board with circuit of the present invention.

FIG. 6 is an enlarged bottom view of each of the opening formation portions of an assembly sheet provided with suspension boards with circuit obtained according to still another embodiment (in which the lead wires in the first openings are linear) of the production method of a suspension board with circuit of the present invention.

In the description given above, the lead wires 6 in the first openings 11 are formed with the protruding portions 15. However, by, e.g., forming the first openings 11 having the same widths as those of the lead wires 6 as shown in FIG. 6, the lead wires 6 in the first openings 11 can also be formed into linear shapes when viewed in bottom view without forming the protruding portions 15.

Figure 7:
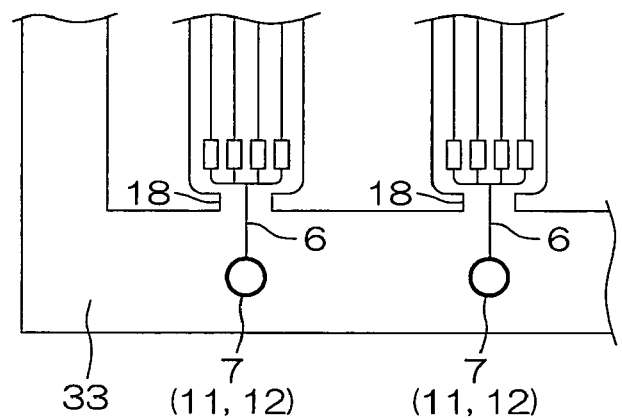
FIG. 7 is a principal-portion plan view of each of the opening formation portions of an assembly sheet provided with suspension boards with circuit obtained according to yet another embodiment (in which the first openings are provided in one-to-one relation to the individual suspension boards with circuit) of the production method of a suspension board with circuit of the present invention.

FIG. 7 is a principal-portion bottom view of each of the opening formation portions of an assembly sheet provided with suspension boards with circuit obtained according to yet another embodiment (in which the first openings are provided in one-to-one relation to the individual suspension boards with circuit) of the production method of a suspension board with circuit of the present invention.

In the description given above, the first openings 11 are provided in one-to-one relation to the individual signal wires 5. However, as shown in FIG. 7, the first openings 11 can also be provided in one-to-one relation to the individual suspension boards with circuit 1.

That is, as shown in FIG. 7, each of the first openings 11 is provided for the plurality of (four) signal wires 5 in one-to-one relation to each of the individual suspension boards with circuit 1.

The lead wires 6 are each branched to be connected to the individual magnetic-head-side connection terminals 8. Specifically, in each of the suspension boards with circuit 1, the branched lead wires 6 are integrated into one lead wire 6 in the vicinity of the joint 18 disposed on the rear end portion of the suspension board with circuit 1. The single integral lead wire 6 passes through the joint 18 to reach the opening formation portion 7 of the supporting frame 33. In the supporting frame 33, the lead wire 6 corresponding in one-to-one relation to the individual suspension board with circuit 1 fills the first opening 11 in one-to-one correspondence.

Thus, in the production method of the suspension board with circuit 1, the lead wires 6 are provided in one-to-one relation to the individual suspension boards with circuit 1. This allows the metal plating layer 16 corresponding to each of the individual suspension boards with circuit 1 to be formed with high reliability.

Figure 8:
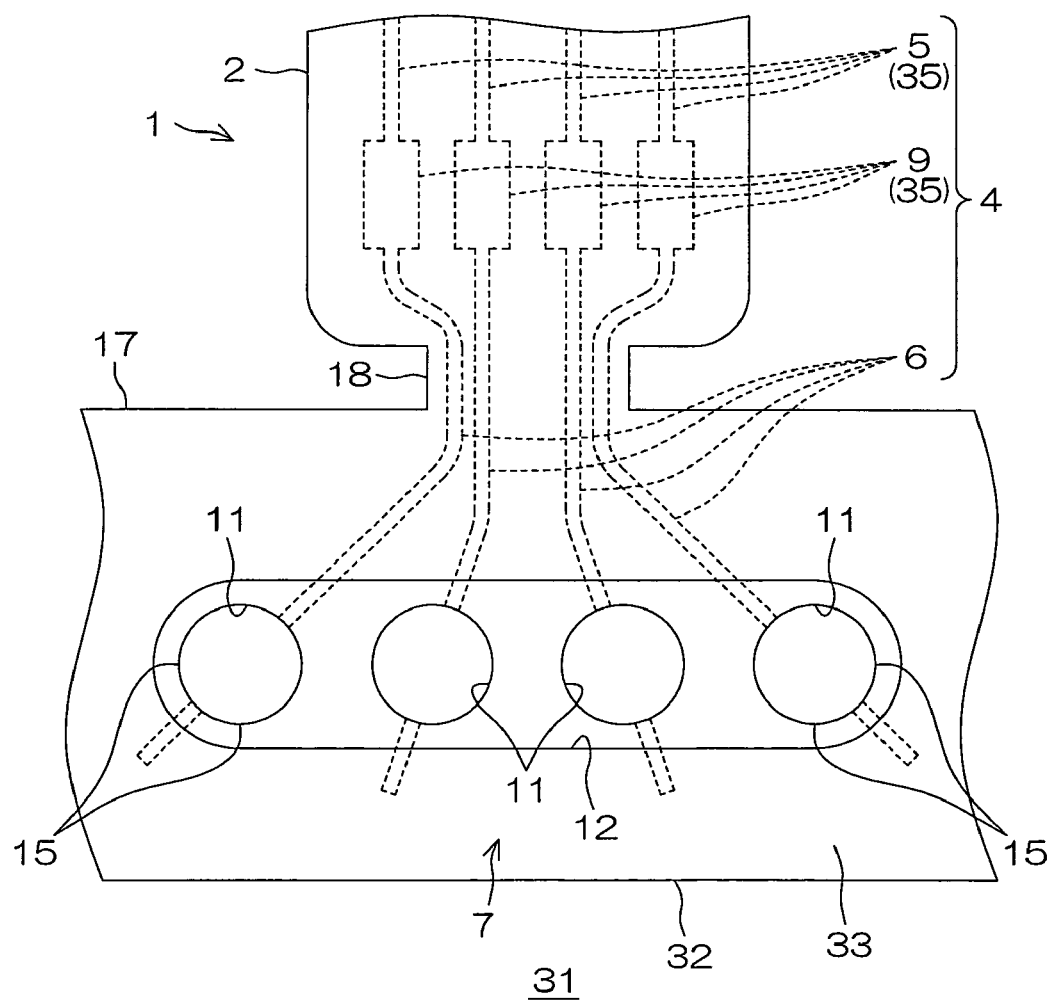
FIG. 8 is an enlarged bottom view of each of the opening formation portions of an assembly sheet provided with suspension boards with circuit obtained according to still another embodiment (in which each of the second openings collectively exposes a plurality of the first openings) of the production method of a suspension board with circuit of the present invention.

FIG. 8 shows each of the opening formation portions of an assembly sheet provided with suspension boards with circuit obtained according to still another embodiment (in which each of the second openings collectively exposes a plurality of the first openings) of the production method of a suspension board with circuit of the present invention.

In the description given above, the second openings 12 are provided so as to individually expose the first openings 11 in one-to-one relation. However, as shown in FIG. 8, it is also possible to, e.g., form the single large opening 12 so as to collectively expose the plurality of (four) first openings 11 therefrom.

That is, the second openings 12 are each formed in one-to-one relation to each of the individual suspension boards with circuit 1 (and for the plurality of (four) first openings 11 corresponding thereto). Each of the second openings 12 surrounds the plurality of (four) first openings 11 when viewed in bottom view, and is formed along the extending direction (widthwise direction) of the supporting frame 33.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A production method of a suspension board with circuit, the production method comprising the steps of:
   forming, on a metal supporting board, an insulating layer formed with a first opening in correspondence to the suspension board with circuit;
   forming a metal thin film on the insulating layer and on the metal supporting board exposed from the first opening;
   forming, on a surface of the metal thin film, a conductive layer having a plurality of signal wires and terminal portions connected to the individual signal wires in correspondence to the suspension board with circuit;
   forming, on the terminal portions, a metal plating layer by electrolytic plating using the metal supporting board as a lead in correspondence to the suspension board with circuit;
   forming a second opening in a portion of the metal supporting board opposing the first opening such that the second opening surrounds the first opening, and is kept from contact with a peripheral edge of the first opening; and
   partially etching the metal supporting board correspondingly to an outer shape of the suspension board with circuit to form a metal supporting layer, and thus form the suspension board with circuit and a surrounding supporting frame which surrounds the suspension board with circuit and supports the suspension board with circuit, wherein,
   in the step of forming the insulating layer, the first opening is formed in the insulating layer at a position where the surrounding supporting frame is formed and which defines an area which is larger relative to an area of the suspension board with circuit where the terminal portions are formed,
   wherein the surrounding supporting frame is formed in a generally rectangular frame shape when viewed in a plan view.

2. The production method of the suspension board with circuit according to claim 1, wherein the first opening is provided in one-to-one correspondence to a single suspension board with circuit.

3. The production method of the suspension board with circuit according to claim 1, wherein the second opening is provided in one-to-one correspondence to the individual first opening.

4. The production method of the suspension board with circuit according to claim 1, wherein the first opening is provided in one-to-one correspondence to each of the individual signal wires.

5. A production method of a suspension board with circuit, the production method comprising the steps of:
- forming, on a metal supporting board, an insulating layer formed with a first opening in correspondence to the suspension board with circuit;
- forming a metal thin film on the insulating layer and on the metal supporting board exposed from the first opening;
- forming, on a surface of the metal thin film, a conductive layer having a plurality of signal wires and terminal portions connected to the individual signal wires in correspondence to the suspension board with circuit;
- forming, on the terminal portions, a metal plating layer by electrolytic plating using the metal supporting board as a lead in correspondence to the suspension board with circuit;
- forming a second opening in a portion of the metal supporting board opposing the first opening such that the second opening surrounds the first opening, and is kept from contact with a peripheral edge of the first opening; and
- partially etching the metal supporting board correspondingly to an outer shape of the suspension board with circuit to form a metal supporting layer, and thus form the suspension board with circuit and a surrounding supporting frame which surrounds the suspension board with circuit and supports the suspension board with circuit, wherein,
- in the step of forming the insulating layer, the first opening is formed in the insulating layer at a position where the surrounding supporting frame is formed and which defines an area which is larger relative to an area of the suspension board with circuit where the terminal portions are formed,
- wherein, in the step of partially etching the metal supporting board correspondingly to an outer shape of the suspension board with circuit to form the metal supporting layer, trenches surrounding individual suspension boards with circuit are formed between the inner peripheral edge portion of the surrounding supporting frame and the outer peripheral edge portions of the suspension boards with circuit, and joints are provided in spanning relation between the suspension boards with circuit and the surrounding supporting frame in such a manner as to traverse the trenches, both by etching.

6. The production method of the suspension board with circuit according to claim 5, wherein the first opening is provided in one-to-one correspondence to each of the individual signal wires.

7. The production method of the suspension board with circuit according to claim 5, wherein the first opening is provided in one-to-one correspondence to a single suspension board with circuit.

8. The production method of the suspension board with circuit according to claim 5, wherein the second opening is provided in one-to-one correspondence to the individual first opening.

* * * * *